United States Patent [19]
Rivet

[11] Patent Number: 6,107,673
[45] Date of Patent: Aug. 22, 2000

[54] SERIES CONNECTION OF DIODES

[75] Inventor: Bertrand Rivet, Angers, France

[73] Assignee: STMicroelectronics S.A., Gentilly, France

[21] Appl. No.: 09/318,290

[22] Filed: May 25, 1999

[30] Foreign Application Priority Data

May 27, 1998 [FR] France ................................. 98 06859

[51] Int. Cl.$^7$ ................................................. H01L 29/93
[52] U.S. Cl. ............................ 257/601; 257/603; 327/194
[58] Field of Search ..................... 247/601, 603; 327/194, 290

[56] References Cited

U.S. PATENT DOCUMENTS 5,559,361  9/1996  Pezzani ............................... 257/546

FOREIGN PATENT DOCUMENTS

| 25 21 848 | 11/1976 | Germany | ................. | H01L 27/08 |
| 36 43 994 | 7/1987 | Germany | ................. | H01L 27/04 |
| 57-036853 | 2/1982 | Japan . | | |
| 57-224715 | 2/1982 | Japan . | | |

OTHER PUBLICATIONS

French Search Report from French Patent Application 98/06859, filed May 27, 1998.

Patent Abstracts of Japan, vol. 6, No. 197 (E–113) Jun. 17, 1982 & JP–A–57 036853 (Nippon Telegr & Teleph Corp.).

Patent Abstracts of Japan, vol. 8, No. 231 (E–274), Oct. 24, 1984 & JP–A–59 114851 (Nippon Denki KK).

*Primary Examiner*—Olik Chaudhuri
*Assistant Examiner*—Douglas A. Wille
*Attorney, Agent, or Firm*—Wolf, Greenfield & Sacks, P.C.; James H. Morris; Theodore E. Galanthay

[57] ABSTRACT

The present invention relates to a high voltage diode which has a fast turn-off, formed of a series connection of several diodes, the relative intrinsic dispersion of recovered charges between the diodes being smaller than 5%.

6 Claims, 3 Drawing Sheets

SERIES CONNECTION OF DIODES

BACKGROUND OF THE INVENTION

1. Field of the Invention

The present invention relates to the realization of a fast diode capable of withstanding a high reverse voltage by using a series connection of several diodes.

2. Discussion of the Related Art

Two solutions are conventionally available when a high voltage diode is desired to be made. A first solution consists of sizing the diode by manufacturing, that is, manufacturing a diode having an avalanche voltage adapted to the high reverse voltage that the diode is to withstand. A second conventional solution consists of connecting several diodes in series so that the sum of their respective avalanche voltages corresponds to the avalanche voltage desired for the high voltage diode. This second solution is often preferred when the diode switching time is desired to be enhanced, that is, when a low switching time upon the switching from the forward on-state to a reverse off-state is desired.

FIG. 1 illustrates the characteristic of the recovery time trr according to the forward voltage VF of the diode. Several characteristics a, b, c have been plotted for diodes having different avalanche voltages. For example, curve a corresponds to a diode having an avalanche voltage Vrma of approximately 1200 volts. Curve b corresponds to the characteristic of a diode having an avalanche voltage Vrmb on the order of 600 volts and curve c corresponds to the characteristic of a diode having an avalanche voltage Vrmc of approximately 300 volts.

FIG. 1 shows that the recovery time of a diode depends on its avalanche voltage and on its forward voltage drop. The smaller the forward voltage of the diode, which is advantageous since it limits the dissipated power when the diode is on, the longer the recovery time.

This drawing also shows that, when a short recovery time is desired (for example, trr0 in FIG. 1), this cannot be obtained with any diode and this requires choosing a diode having a sufficiently small avalanche voltage. If the diode has to withstand a higher reverse voltage, several diodes generally have to be connected in series to obtain the desired reverse voltage withstand by adding the avalanche voltages of these series-connected diodes. Two diodes having a same 300-volt avalanche voltage will for example be used to form a fast diode having a 600-volt avalanche voltage. Of course, the forward voltage drop of the obtained high voltage diode corresponds to the sum of the forward voltage drops of the series-connected diodes.

FIG. 2 illustrates the series connection of two diodes D1, D2 intended to behave as a high voltage diode. Conventionally, a capacitor C1, C2 is placed in parallel on each diode to form a dynamic balancing network. The function of capacitors C1 and C2, the values of which are empirically determined and are on the order of several hundred picofarads, is to minimize the influence of an imbalance between the recovered charges of the two series diodes.

The recovered charges are defined as being the time integration of the reverse current flowing through the diode at the time of its blocking (becomes non-conducting). This definition is illustrated by FIG. 3 which schematically shows the current I in a diode according to time at its blocking. It is assumed that at a time t0, the biasing across a diode is inverted by forcing the current to vary with a constant slope. Thus, current I decreases from a value IF corresponding to the direct current flowing through the diode before its blocking to a negative value Irm, before increasing to become zero. The duration (between times t1 and t2) during which the diode conducts a reverse current is called the reverse recovery time trr. This duration is necessary to the evacuation of the remaining stored charges when the direct current becomes zero (time t1). These remaining charges are called the recovered charges. The amount of recovered charges depends on several factors and, in particular, on the current decrease slope at the diode blocking. The other parameters acting upon the amount of recovered charges are, in particular, the current IF flowing through the diode before it becomes non-conducting, the operating junction temperature, and the voltage applied in reverse to the diode for its blocking.

A diode, at its switching off, can as a first approximation be modeled by two capacitors in parallel, one representing the diode junction capacitance and the other representing a capacitance linked to recovered charges Qrr.

FIG. 4 shows an electric diagram equivalent to the diagram of FIG. 2 at the end of the switching, during the blocking.

It is assumed that diodes D1 and D2 have respective recovered charges different from each other by a value ΔQrr, the recovered charge of diode D2 being greater than that of diode D1. In FIG. 4, both diodes have been modeled at the time when diode D1 has evacuated all its recovered charges and where there only remains for diode D2 to evacuate the excess of recovered charges ΔQrr that it has with respect to diode D1. Diode D1 thus is modeled by its junction capacitance Cj1 and diode D2 is modeled by its junction capacitance Cj2 in parallel with a capacitance Crr linked to the excess of recovered charges AQrr that diode D2 still has to evacuate. Indeed, the current which flows in reverse through the series-connected diodes is the same, so that the difference of recovered charges between the two diodes translates, at the end of the blocking, as the presence of a capacitor of recovered charges in parallel on the junction capacitor of a single one of the two diodes.

In the absence of capacitors C1 and C2, when diode D1 has eliminated all its recovered charges, it is in the blocked (non-conducting) state while the second diode still contains recovered charges, that is, it is reverse-conductive. All the reverse voltage is then across the first diode. Since this first diode is chosen with an avalanche voltage slightly greater than half the applied reverse voltage, it thus starts an avalanche.

Thus, in prior art, it has been considered as necessary to provide external balancing capacitors C1 and C2 to minimize the influence of capacitance Crr linked to the recovered charges in the final diode blocking phase. For this purpose, two capacitors of significant value are generally provided, to make capacitances Cj1 and Cj2+Crr negligible as compared to the capacitances of capacitors C1 and C2 (FIG. 2).

An example of application in which series diodes are often used to improve the switching time of a high voltage diode system is the field of switched-mode power supplies. The search for the shortest possible switching time trr here is due to the desire of minimizing energy losses by dissipation at the switchings.

The presence of balancing capacitors adversely affects the miniaturization and increases the cost of switched-mode power supplies and other systems in which a fast high voltage diode is desired to be made by series connection of several diodes. Further, capacitors increase energy losses by dissipation at switching.

SUMMARY OF THE INVENTION

The present invention provides a fast high voltage diode by the series connection of several diodes while reducing or minimizing the use of dynamic balancing capacitors.

A characteristic of the present invention is to connect in series several diodes, all sized to have a same avalanche voltage, and selected to exhibit, with respect to one another, a limited recovered charge dispersion associated, preferably, with a limited relative forward voltage drop dispersion. Thus, instead of trying to solve the problems of dynamic balancing of the series-connected diodes by means of external components, the present invention provides, conversely, to act upon the very diodes.

More specifically, the present invention provides a high voltage diode which has a fast turn-off formed of a series connection of several diodes, the relative intrinsic dispersion of recovered charges between the diodes being smaller than 5%.

According to an embodiment of the present invention, the relative forward voltage drop dispersion between the diodes is smaller than 5%.

According to an embodiment of the present invention, the fast high voltage diode is formed of a series connection of n diodes, the absolute recovered charge dispersion between the diodes being smaller than the difference between n times the minimum avalanche voltage of one of the series diodes and n-1 times the reverse nominal voltage for which the high voltage diode is provided, multiplied by the junction capacitance of one of the series diodes, this junction capacitance being given at 80% of the avalanche voltage of one of the series diodes.

According to an embodiment of the present invention, the diodes connected in series are taken from a same silicon wafer.

According to an embodiment of the present invention, the diode is formed of a series connection of several diodes, which diodes are taken from adjacent diodes on the same silicon wafer on which the diodes are made.

The foregoing and other objects, features and advantages of the present invention will be discussed in detail in the following non-limiting description of specific embodiments in connection with the accompanying drawings.

DETAILED DESCRIPTION

Figure 5:
FIG. 5 shows a series diode circuit according to the present invention.
Figure 6:
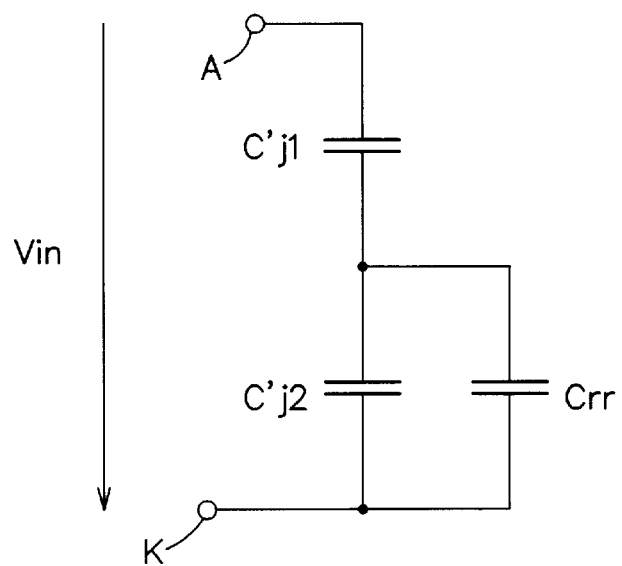
FIG. 6 shows the equivalent diagram of the two diodes of FIG. 5 at the end of the switching off.

FIG. 5 shows a fast high voltage diode according to the present invention provided with an anode terminal A and with a cathode terminal K. This diode is formed of at least two diodes D'1 and D'2 connected in series between terminals A and K. FIG. 6 is an equivalent electric diagram of these two diodes at the end of a switching off. Diode D'1 is modeled by its junction capacitor C'j1 and diode D'2 is modeled by its junction capacitor C'j2 in parallel with a capacitor Crr representing the difference of recovered charges ΔQrr between the two diodes.

According to a first aspect of the present invention, diodes D'1 and D'2 have a same avalanche voltage (differing by the technological dispersions) and these diodes are coupled so that, in the application for which the high voltage fast diode is intended, the following condition is fulfilled:

$$\Delta Qrr < Cj(2 \text{ Vrm} - \text{Vin}), \quad (1)$$

where Vrm represents the minimum avalanche voltage of one of the diodes, Vin represents the nominal reverse voltage that the high voltage diode is to be able to withstand in the considered application, and where Cj stands for the junction capacitance of one of the diodes, given at 80% of the avalanche voltage. It is assumed that diodes D'1 and D'2 have identical (Cj) respective junction capacitances (C'j1, C'j2).

According to the present invention, a circuit including two series-connected diodes fulfilling condition (1) hereabove does not require being associated with a dynamic balancing array.

Indeed, the condition to be fulfilled to avoid using external dynamic balancing capacitors is that voltage V1 across junction capacitance C'j always remains lower than the avalanche voltage Vrm of diode D'1.

Voltage V1 can be expressed as:

$$V1 = Vin - V2,$$

where V2 represents the voltage across the junction capacitance C'j2.

As a first approximation, it can be assumed that, when diode D'1 has evacuated all its recovered charges (the case modeled in FIG. 6), voltage V2 can be expressed as:

$$V2 = (Cj \text{ Vin} - \Delta Qrr)/2Cj,$$

with capacitance Crr being expressible as ΔQrr/V2.

As a result, voltage V1 which must be smaller than Vrm can be expressed as:

$$(Cj \text{ Vin} + \Delta Qrr)/2Cj.$$

More generally, for a series connection of n diodes, the condition which, according to the present invention, has to be fulfilled to avoid using a dynamic balancing array is:

$$\Delta Qrr < Cj(n \text{ Vrm} - (n-1)\text{Vin}).$$

An advantage of the present invention according to its first aspect is that it provides a fast high voltage diode which, in the application for which it is provided, and avoids the use of dynamic balancing capacitors.

According to a second aspect of the present invention, it is assumed that the general recovered charge difference ΔQrr between two diodes connected in series essentially has two origins. A first amount of the recovered charge difference ΔQrri is considered as being intrinsic to the diodes and as originating, in particular, from the technological dispersions associated with their manufacturing. This amount will be referred to hereafter as the intrinsic recovered charge difference. A second amount of recovered charge difference ΔQrrf is assumed to originate from the diode environment and operation. This amount will be referred to hereafter as the functional recovered charge difference. The general recovered charge difference corresponds to the sum of the intrinsic and functional differences (ΔQrr=ΔQrri+ΔQrrf).

A feature of the present invention is, according to this second aspect, to select the diodes to be associated in series so that the relative intrinsic recovered charge dispersion (ΔQrri/Qrri) of the diodes with respect to one another is smaller than 5%. Thus, according to this second aspect, all the series diodes D'1, D'2 (FIG. 5) in a circuit according to the present invention are selected to have close intrinsic recovered charge amounts. With such a relative intrinsic recovered charge dispersion, the value of capacitance Crr (FIG. 6) in parallel on one of the junction capacitances at the end of the diode switching off is considerably reduced.

Another feature of the present invention according to this second aspect provides that the diodes that constitute a same circuit of series diodes have a relative forward voltage drop dispersion ($\Delta VF/VF$) smaller than 5%.

By limiting the forward voltage drop dispersion, the amount of recovered charge variation $\Delta Qrrf$ which is due to the diode environment and operation is reduced or minimized. Indeed, it may be assumed that amount $\Delta Qrrf$ essentially depends on the difference between the diode junction temperatures ($\Delta Tj$).

Now, this junction temperature difference between the diodes may be expressed, as a first approximation, as follows:

$$\Delta Tj = P \cdot \Delta Rth + Rth \cdot \Delta P,$$

where Rth designates the junction-case thermal resistance and where P designates the dissipated power. This dissipated power is directly proportional to the forward diode voltage.

Accordingly, by minimizing or reducing the relative forward voltage dispersion, the dissipated power dispersion and, accordingly, the junction temperature difference are minimized or reduced.

With such diodes, capacitance CrT associated with the total recovered charge dispersion (intrinsic and functional) is minimized or reduced. As a result, the balancing capacitors that are required to be placed in parallel on each of the diodes can, according to this second aspect of the present invention, be at least of smaller capacitance than with any diode coupling and, in most applications, be eliminated (the junction capacitances being sufficient for the dynamic balance).

To omit the external balancing capacitors, it is enough that, as the diodes are turned on, the voltage applied again across terminal D'1 (the diode with the less recovered charges) remains lower than its avalanche voltage. This condition is fulfilled if capacitance Crr is sufficiently small as compared to capacitor Cj2 with which it is in parallel (FIG. 6).

As a specific example of embodiment, in an application of the present invention to a switched-mode power supply or to a power factor correction circuit, a series diode circuit according to the present invention is provided to form the power diode. Two diodes each having an avalanche voltage Vrm of 300 volts are for example used to form a diode having a 600-volt avalanche voltage but generally only seeing upon its switching off a voltage Vin on the order of 450 volts. Taking the case of two diodes, the respective junction capacitances of which are on the order of 25 picofarads and of a circuit supplied from the mains A.C. voltage (for example, 220 volts), fulfilling the above conditions concerning the relative recovered charge intrinsic dispersion ($\Delta Qrri/Qrri$) and the relative forward voltage dispersion ($\Delta VF/VF$) avoids using balancing capacitors without resulting in one of the diodes being in avalanche turn-off.

Thus, the present invention brings, in all cases, a reduction in bulk and cost and a reduction in energy losses.

Figure 1:
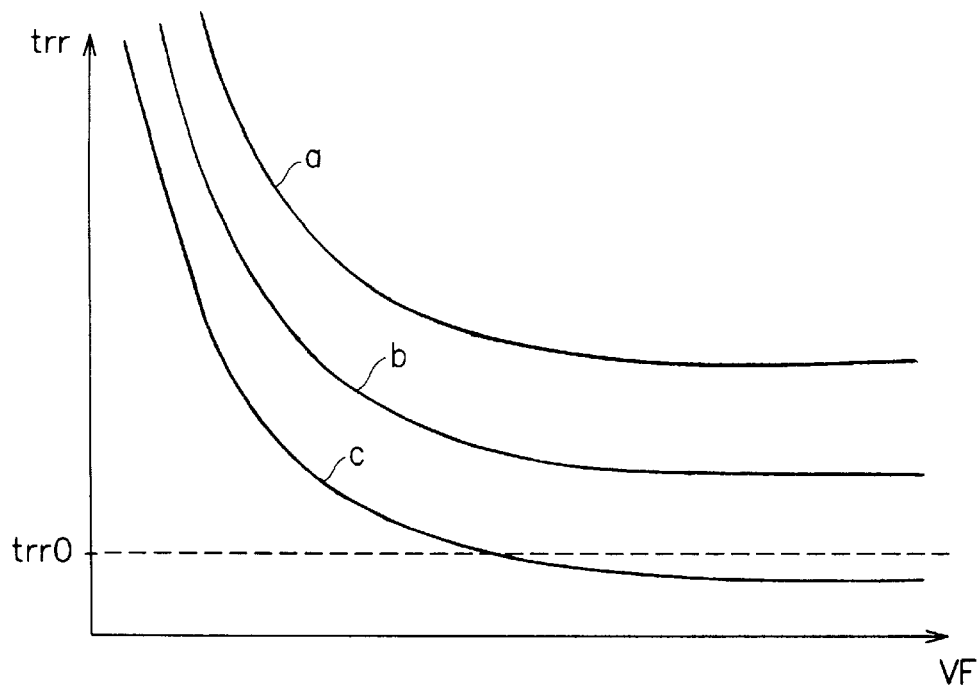
FIGS. 1 to 4, previously described, are meant to show the state of the art and the problem to solve.
Figure 2:
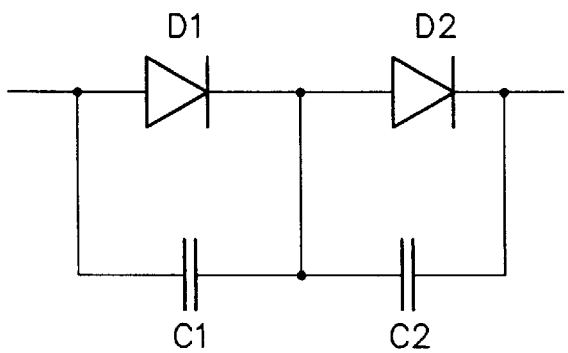
Figure 3:
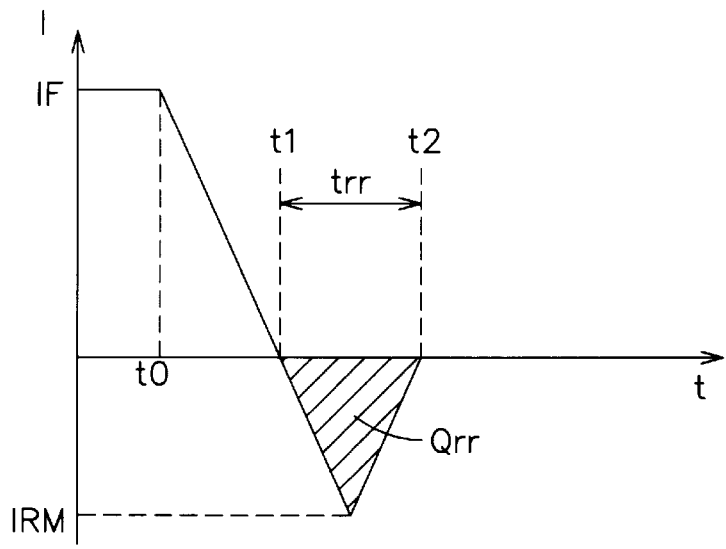
Figure 4:
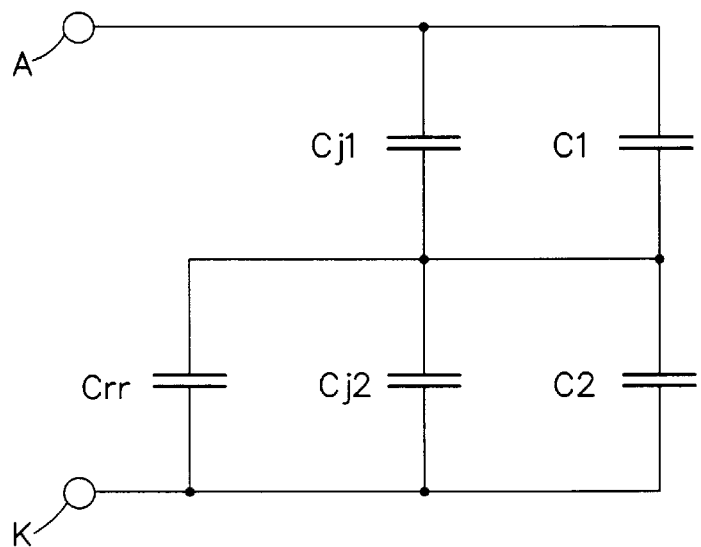

It should be noted that the recovered charges are measured at a given temperature, starting with a given forward current (IF, FIG. 3), and with a given current decrease slope for a given reverse reapplied voltage.

The conditions of determination of amount Qrri are, for example, a reapplied voltage Vr of 200 volts, a forward current IF of 8 A, a current decrease slope dI/dt of 200 A/$\mu$s, and a junction temperature of 125° C.

Another feature of the present invention is to provide a particularly simple solution to connect in series several diodes which fulfill the association conditions determined hereabove.

According to the present invention, a circuit of several diodes in series is, preferably, formed of several diodes taken in the vicinity of one another (such as adjacent diodes) on a same silicon wafer. Such a solution minimizes or reduces the effects of technological dispersions between the different chips. Such a solution is much preferable to a sorting of the diodes from a batch to select two or more diodes fulfilling the chosen criteria. Indeed, a selection by sorting results in more losses (that is, a greater number of components which cannot be used to respect the determined conditions), especially if this sorting is performed on the two criteria of the relative intrinsic recovered charge dispersion and forward voltage dispersion. The fact of taking two neighboring chips from a same silicon wafer in which the diodes have been made fulfills both conditions of a relative intrinsic recovered charge dispersion under 5% and of a forward voltage dispersion under 5% without it being necessary to perform complex sorting measurements.

Another advantage of the present invention is that is enables making high voltage diode circuits connecting several diodes in series which combine features of short recovery time trr and high avalanche voltage, without requiring the provision of high value capacitors for a dynamic balancing array. In most cases, the present invention even enables completely avoiding the use of a dynamic balancing array.

Of course, the present invention is likely to have various alterations, modifications, and improvements which will readily occur to those skilled in the art. In particular, determining the need for external balancing capacitors for a diode circuit fulfilling the conditions of the second aspect is within the abilities of those skilled in the art. It is enough, for this purpose, to check whether the criterion of the first aspect of the present invention taking account of the application is or is not fulfilled according to the application for which the considered diodes are intended.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A fast high voltage diode formed of a series connection of n diodes, wherein an absolute recovered charge dispersion between the diodes is smaller than the difference between n times a minimum avalanche voltage of one of the series diodes and n-1 times a reverse nominal voltage for which the high voltage diode is provided, multiplied by a junction capacitance of one of the series diodes, this junction capacitance being given at 80% of the avalanche voltage of one of the series diodes, and wherein the relative intrinsic dispersion of recovered charges between the diodes is smaller than 5%.

2. The diode of claim 1, wherein the relative forward voltage drop dispersion between the diodes is smaller than 5%.

3. The diode of claim 1, wherein the diodes connected in series are taken from a same silicon wafer.

4. The diode of claim 3, wherein the diodes used in the diodes connected in series are taken from adjacent diodes on the same silicon wafer.

5. The diode of claim 1, wherein the diodes connected in series are taken from the same silicon wafer.

6. The diode of claim 5, wherein the diodes used in the diodes connected in series are taken from adjacent diodes on the same silicon wafer.

* * * * *